(12) United States Patent
Khanna et al.

(10) Patent No.: US 7,808,223 B1
(45) Date of Patent: Oct. 5, 2010

(54) TRANSISTOR WITH SPATIALLY INTEGRATED SCHOTTKY DIODE

(75) Inventors: Sandeep Khanna, Los Altos, CA (US); Mozafar Maghsoudnia, San Jose, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 546 days.

(21) Appl. No.: 11/746,016

(22) Filed: May 8, 2007

(51) Int. Cl.
*G05F 1/10* (2006.01)
*G05F 1/34* (2006.01)

(52) U.S. Cl. .................. 323/272; 323/225; 257/133; 257/476; 257/487; 363/147

(58) Field of Classification Search .................. 323/225, 323/268, 271, 272, 282, 350; 363/147; 257/133, 257/476, 487
See application file for complete search history.

(56) References Cited

U.S. PATENT DOCUMENTS

| | | | |
|---|---|---|---|
| 3,586,930 A * | 6/1971 | Das et al. ............... 257/401 |
| 5,682,054 A * | 10/1997 | Nakashima ............ 257/401 |
| 5,708,619 A * | 1/1998 | Gillingham ............ 365/230.06 |
| 5,770,504 A | 6/1998 | Brown et al. |
| 5,955,872 A | 9/1999 | Grimm |
| 6,366,155 B1 | 4/2002 | Moon et al. |
| 6,429,633 B1 * | 8/2002 | Kajiwara et al. ......... 323/282 |
| 7,148,665 B2 | 12/2006 | Agari et al. |
| 7,391,200 B1 | 6/2008 | Khanna et al. |
| 2002/0053658 A1 * | 5/2002 | Okamoto et al. ...... 252/299.01 |
| 2003/0080355 A1 * | 5/2003 | Shirai et al. ............ 257/200 |
| 2006/0205168 A1 * | 9/2006 | Zuniga et al. .......... 438/300 |
| 2007/0030061 A1 | 2/2007 | Cho et al. |

OTHER PUBLICATIONS

Leroux et al., "Building in Reliability With Latch-Up, ESD and Hot Carrier Effects on A 0.25 uM CMOS Technology," Solid-State Device Research Conference, 1997. Proceeding of the 27th European, Sep. 22-24, 1997, pp. 464-467.

* cited by examiner

*Primary Examiner*—Gary L Laxton
*Assistant Examiner*—Nusrat J Quddus
(74) *Attorney, Agent, or Firm*—Mahamedi Paradice Kreisman LLP; William L. Paradice, III; Christopher J. Brokaw

(57) ABSTRACT

An integrated circuit device for delivering power to a load includes a composite transistor and a composite schottky diode. The composite transistor is formed by a plurality of component transistors that have commonly coupled source terminals, commonly coupled drain terminals and commonly coupled gate terminals. The composite schottky diode is formed by a plurality of component schottky diodes that have anodes coupled in common and coupled to the source terminals of the plurality of component transistors, and for which drain terminals of the commonly coupled drain terminals constitute respective cathodes.

18 Claims, 3 Drawing Sheets

(Prior-Art)

(Prior-Art)

TRANSISTOR WITH SPATIALLY INTEGRATED SCHOTTKY DIODE

TECHNICAL FIELD

The present invention relates to integrated circuit devices for use in power delivery systems.

BACKGROUND

Power delivery in modern integrated circuit (IC) systems has become increasingly complex as supply voltages fall and power demands become more variant. A number of modern microprocessor systems, for example, require load voltage to be dynamically adjusted in response to processing demand, with voltage overshoot/undershoot to be maintained within closely specified ranges as load voltages change. IC-based power regulation and delivery systems have been developed to meet these requirements.

FIGS. 1A and 1B illustrate the structure and operation of a prior-art power-stage integrated circuit (IC) device 100 that may be used in an IC-based power delivery system. The power stage IC 100 includes a gate driver circuit 103 that alternately switches on a power transistor 105 and a bypass transistor 107 in response to a power-control signal (Pctrl). More specifically, when the control signal (Pctrl) goes high as shown by pulse 122, the power-stage IC 100 enters a power-delivery phase, or power phase, in which the gate driver 103 asserts a drive signal (Drv) as shown at 124 to switch the power transistor 105 to a conducting state, thereby enabling current to be delivered to a load $R_L$ after passing through a smoothing filter (low-pass filter) formed by inductor $L_F$ and capacitor $C_F$. When, the control signal goes low, the gate driver 103 deasserts the drive signal, switching off the power transistor 105 and thus, decoupling the smoothing filter and load from voltage source, V+. A brief interval after the power transistor 105 is switched off, referred to herein as a dead time (130a) and provided to avoid the potential for shorting the V+ power supply to ground through transistor 107, the gate driver asserts a bypass signal (Byp) to switch the bypass transistor 107 to a conducting state and thus provide a low-resistance path for maintaining the load current through inductor $L_F$ until the next power phase. The interval in which the bypass transistor 107 is switched on (i.e., the bypass-signal assertion interval 126) is referred to herein as the bypass phase of the power-stage IC operation, and the current flowing through the inductor during this time is referred to as the bypass current. The bypass signal is deasserted for a second, brief dead-time interval 130b prior to the start of a subsequent power-delivery phase, again to avoid shorting the V+ supply to ground. Overall, the power phase, bypass phase, and interposed dead-time intervals constitute a power cycle of the power-stage IC and are repeated every switching period, $T_{SWITCH}$. As more or less current is required by the load (i.e., in the case of a processing system, the demand for power may increase or decrease dramatically depending on processing needs), a controller (not shown in FIG. 1A) may adjust the duty cycle of the power control signal (i.e., increase the relative proportions of the switching period allocated to assertion of the drive signal and bypass signal) to enable more or less current to the load. Also, while a single power-stage IC is shown, multiple power-stage IC's may be provided, each to source power to the load during respective time-staggered power phases within each switching period.

As mentioned, the dead-time intervals 130a and 130b are provided to avoid shorting the V+ supply to ground during the transition between conduction phases of the power and bypass transistors 105 and 107. Unfortunately, though the dead-time intervals are brief, the bypass current is drawn through a relatively high-loss path of the body diode 109 formed between the source and drain of the bypass transistor 107. In a typical silicon-substrate power-stage IC, the cut-in voltage of the body diode 109 is approximately 0.6 volts so that the total power loss during the dead-time intervals 130a, 130b is the body-diode cut-in voltage, $V_{BD}$, multiplied by the bypass current, $I_{BYP}$. As the bypass current may be on the order of tens of amperes, this power dissipation in the device body may be substantial, resulting in significant wasted power. Aside from the loss of efficiency, the heat generation that results from power dissipation in the body diode may ultimately limit the maximum load current the power-stage IC may source.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A power-delivery integrated circuit (IC) device having an on-die schottky diode to reduce dead-time loss is disclosed in various embodiments herein. As discussed in greater detail below, the schottky diode may be coupled between the source and drain of a bypass transistor within the power-stage circuitry of the power-delivery IC and, due to the lower cut-in voltage (approximately 0.4 volts as opposed to approximately 0.6 volts for the silicon-substrate body diode) of the schottky barrier, provide a substantially lower-resistance dead-time current path, and thereby reduce power dissipation and heat build-up within the power-delivery IC. Also, while the schottky diode and bypass transistor may be laid out side by side with metal-layer or polysilicon interconnection between their respective terminals, in one embodiment, the schottky diode is formed by a number of schottky components that are coupled in parallel with one another to form a composite schottky diode and that are interspersed within (i.e., integrated within the same area as) an array of transistor components that are coupled in parallel with each other to form the bypass transistor. A particularly area-efficient structure is achieved in at least one embodiment, through sharing of N+ regions (i.e., negatively doped regions) of the transistor array as both the cathode of a schottky component and the drain of an adjacent transistor component, with the schottky component and transistor component being formed within the same high-voltage, negatively-doped well (HV N-well). Also, the integrated schottky approach yields extremely short interconnection paths between terminals of the composite schottky diode and the composite bypass transistor (i.e., the composite schottky diode having multiple schottky diode components (also called schottky structures) coupled in parallel to achieve a schottky device of desired size, and likewise, multiple transistor components (or transistor structures) coupled in parallel to achieve a transistor having a desired size), and thereby avoiding resistive losses (i.e., IR losses) in the conduction paths between the terminals of the schottky diode and bypass transistor that, absent such tight spatial integration, may otherwise cancel or reduce the improvement intended by provision of the schottky diode. Additionally, because the schottky diode is a majority carrier device (in contrast to the minority-carrier body diode), susceptibility to latch-up is reduced, increasing the feasibility of using a P-type metal-oxide-semiconductor (MOS) transistor as the power transistor. Power-delivery IC devices having a P-type MOS (P-MOS) power transistor and components, layouts and methods relating to same are disclosed, for example and without limitation, in U.S. patent application Ser. No. 11/670,924, filed Feb. 2, 2007 and entitled "P-Channel Power Chip." application Ser. No. 11/670,924 is hereby incorporated by reference in its entirety.

Figure 1A:
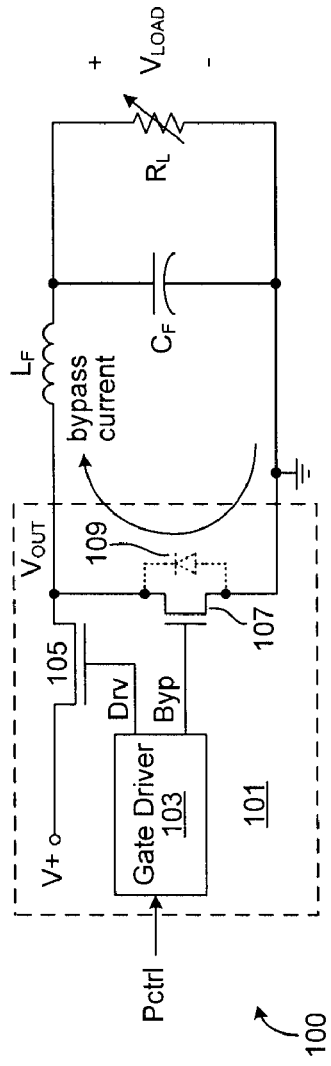
FIGS. 1A and 1B illustrate the structure and operation of a prior-art IC-based power delivery system.
Figure 1B:
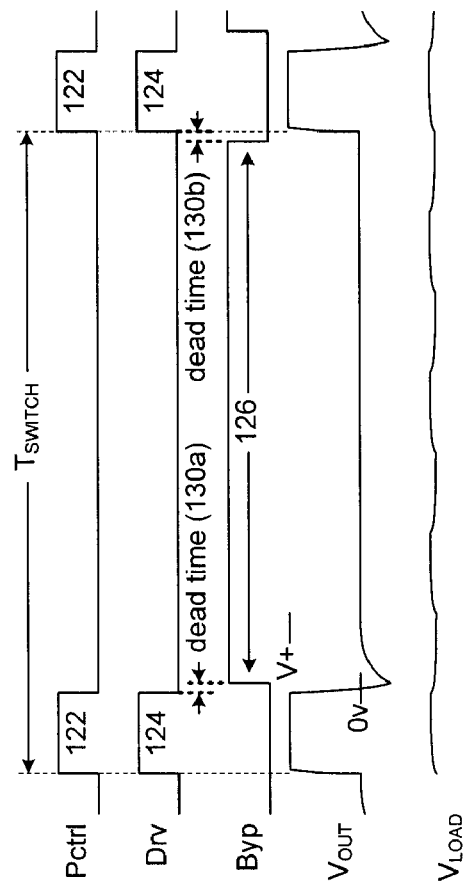
Figure 2:
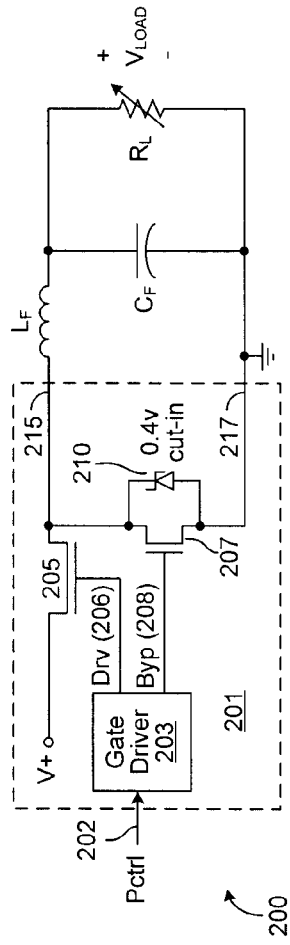
FIG. 2 illustrates a power-stage circuit within a power-delivery IC according to one embodiment.

FIG. 2 illustrates a power-stage circuit 200 within a power-delivery IC according to one embodiment. The power-stage circuit 200 includes a gate driver circuit 203, power transistor 205, bypass transistor 207 and schottky diode 210. In the particular embodiment shown, the power transistor 205 is implemented by a P-MOS transistor, though an N-MOS transistor may alternatively be used. The drains of the power transistor 205 and bypass transistor 207 are coupled to one another at an output node of the power-stage circuit 200, with the sources of the power transistor 205 and bypass transistor 207 being coupled to a supply voltage (V+) and reference voltage (ground in this example), respectively. The gates of the power transistor 205 and bypass transistor 207 are coupled to receive a drive signal 206 (Drv) and bypass signal 208 (Byp), respectively, from the gate driver 203. The output node 215 of the power-stage circuit (i.e., the drain nodes of transistors 205 and 207) is coupled through filter inductor $L_F$ to the supply input of a variable-resistance load $R_L$ (which may be, for example and without limitation, processing circuitry, logic circuitry and/or analog circuitry within another integrated circuit device or system of integrated circuit devices). The source terminal of the bypass transistor 207 forms the return node 217 for current supplied via output node 215 and is coupled to the other end of the variable-resistance load $R_L$, which may be grounded as shown or tied to another fixed reference voltage. A filter capacitor $C_F$ is coupled in parallel with the variable-resistance load $R_L$ and thus across the supply and return nodes (215, 217) of the power-stage circuit 200. Together, the inductor $L_F$ and capacitor $C_F$ form a low-pass filter (an LC filter), to smooth the voltage across the load, $V_{LOAD}$. The gate driver 203 responds to control pulses within a pulse control signal 202 (Pctrl) by asserting (i.e., driving high or low according to whether an N-MOS or P-MOS device is used to implement the power transistor 205) the drive signal 206 during assertion of the control pulse, and then asserting the bypass signal 208 when the control pulse is deasserted, with intervening dead-times between drive and bypass signal assertions generally as shown in FIG. 1B. By this arrangement, supply current is delivered to the load $R_L$ via the power transistor 205 during the power phase of each switching period (i.e., the duration of the power phase being controlled, for example, by the width of a pulse within the power-control signal), with the current through inductor $L_F$ and thus the load $R_L$ passing through the bypass transistor 207 during the bypass phase. The anode and cathode of the schottky diode 210 are coupled to the source and drain terminals of the bypass transistor 207, respectively, thus providing a reduced cut-in-voltage conduction path during the dead-time intervals (i.e., brief intervals between assertion of the drive and bypass signals, when neither of the signals 206, 208 is asserted) relative to the body-diode conduction path described in reference to FIGS. 1A and 1B.

Figure 3:
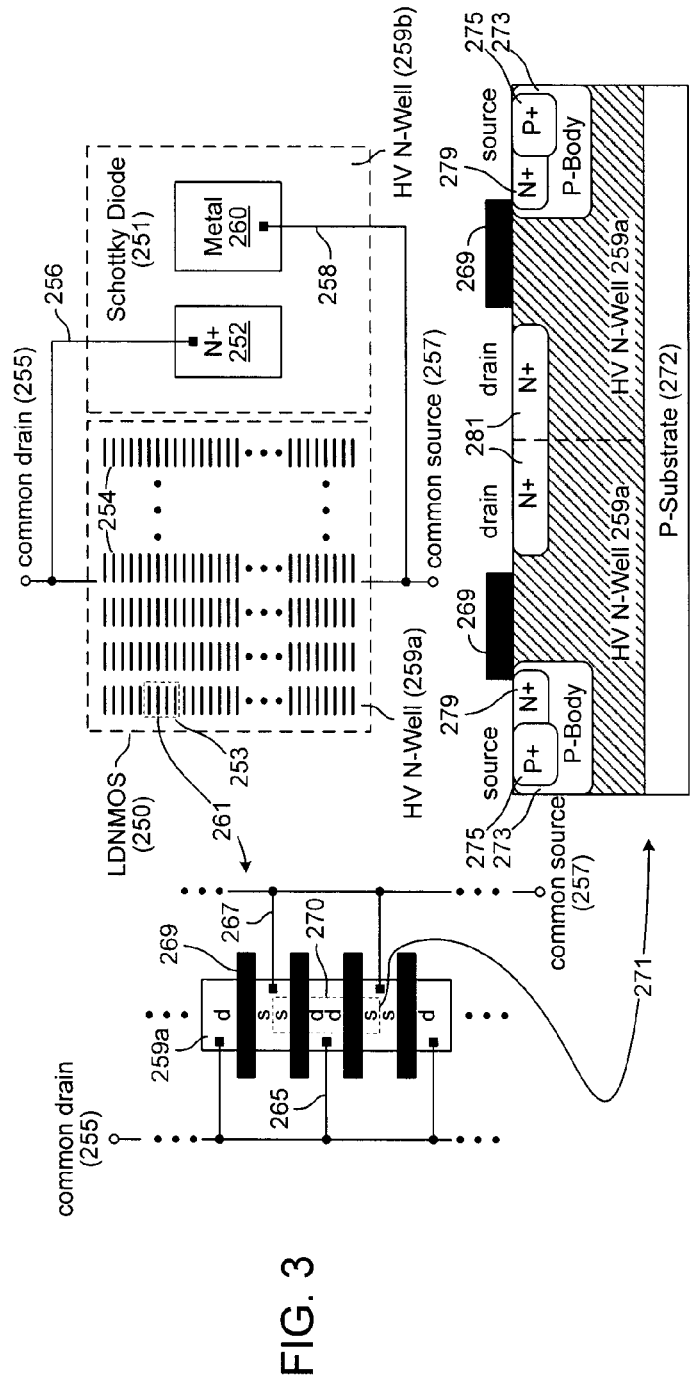
FIG. 3 illustrates an exemplary layout and interconnection of the bypass transistor and schottky diode of FIG. 2.

FIG. 3 illustrates an exemplary layout and interconnection of the bypass transistor 207 and schottky diode 210 of FIG. 2. In the embodiment shown, the bypass transistor, which must generally be large enough to pass substantial current, is implemented by a laterally diffused, N-MOS (LDNMOS) transistor 250; a transistor which is itself formed by an array of transistor components 254 having commonly coupled drains, sources and gates, respectively. Referring to detail view 261 of a group of transistor components 253, for example, a high-voltage N-well 259a (HV N-well) is doped in respective regions to establish drain and source nodes (denoted 'd' and 's', respectively, in detail view 261), with polysilicon gates 269 disposed over the channel between each drain and source. Metal layer interconnections (or other conductive structures) are provided to couple the drains of all the transistor components together (i.e., connections 265, forming a common drain 255) and also to couple the sources of all the transistor components together (i.e., connections 267, forming a common source 257). The gate terminals of the component transistors are also interconnected to form a common gate, though the interconnections are not specifically shown in detail view 261.

Detail view 271 illustrates an exemplary profile view of a pair of transistors within transistor group 253 (the pair of transistors being shown in dashed outline 270 within view 261). As shown, the HV N-well 259a is formed within a P-type substrate 272, and source and drain terminals may be formed by appropriately doped regions within the HV N-well 259a. For example, the source terminals may be formed by a P-doped body region 273, having a P+ region 275 and N+ region 279 disposed therein. Drain terminals may be formed by N+ doped regions 281 within the HV N-well 259a, with gate terminals implemented by polysilicon layers 269 disposed over the substrate 272 between the source and drain terminals. As detail view 271 illustrates, the side-by-side disposition of component transistors provides a particularly area-efficient layout as a single N+ region 281 may be shared to establish the two drain terminals of adjacent transistors and (as shown in detail view 261) interconnected to other drain terminals with a shared connection 265. Similarly, though not specifically shown in detail view 271, source terminals of adjacent transistors (i.e., transistors having adjacent source terminals) may be formed by a shared doped region (i.e., shared regions 273 and 275 at least) and interconnected to other source terminals within the LDMOS structure by a shared connection 267. Overall, the sharing of source and drain structures in this manner permits a large number of LDMOS component transistors to be formed in substantially less area that would otherwise be required.

Still referring to FIG. 3, as shown, a schottky diode 251 may be laid out side-by-side with the LDMOS transistor (which may be viewed as an interconnection of aggregate component transistors to form the composite LDMOS transistor), and formed within an HV N-well 259b by an N+ cathode 252 and metal anode 260 (which metal may be disposed over the HV N-well 259a using any number of deposition, epitaxial or other techniques). The N+ cathode 252 may be coupled to the common drain 255 of the LDMOS transistor (an LDNMOS transistor in this particular example, as the bypass transistor is implemented as an N-type MOS device) via interconnection structure 256 and the metal anode 260 similarly coupled to the common source 257 of the LDMOS transistor 250 via interconnection structure 258.

One challenge posed by the arrangement of FIG. 3 is that the interconnection structures 256 and 258 (e.g., interconnections established by one or more metal layers or other conductive layers) tend to exhibit significant resistance due to the path length required to extend from the schottky cathode and anode (252, 260) to the common drain and source (255, 257), respectively, of the LDMOS transistor 250. While such arrangement may function effectively, providing the above-described benefit of net power savings (i.e., even after accounting for power loss due to conduction over interconnection structures 256 and 258, the reduced cut-in of the schottky diode 251 yields more efficient operation and/or reduced likelihood of latch-up), resistive losses on interconnection paths 256 and 258 may substantially reduce or even eliminate altogether the efficiency gain otherwise achieved by provision of the schottky diode 251.

Figure 4:
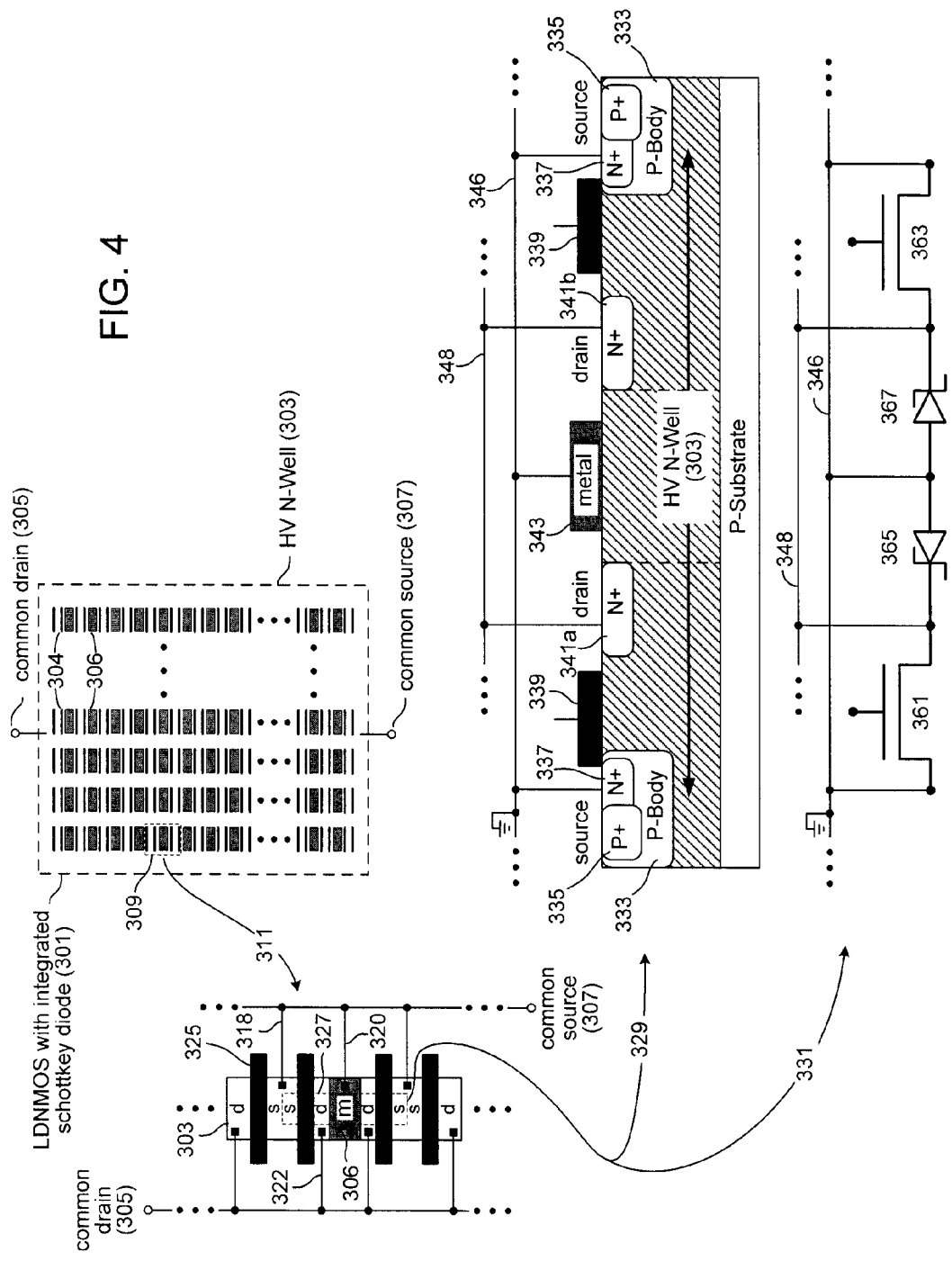
FIG. 4 illustrates an embodiment in which the schottky diode of FIG. 3 is decomposed into component schottky structures 306 (component schottky diodes) and integrated within the layout of component transistors 304 of a laterally-diffused, metal-oxide semiconductor (LDMOS) transistor, yielding an integrated LDMOS-schottky device.

FIG. 4 illustrates an alternative embodiment in which the schottky diode 251 of FIG. 3 is decomposed into component schottky structures 306 (component schottky diodes) and integrated (or interspersed) within the layout of component transistors 304 of an LDMOS structure, yielding an integrated LDMOS-schottky device 301. By interspersing component schottky structures 306 between component transistors 304 in this manner, extremely low resistance interconnection paths between the common cathode and anode terminals of the composite (or aggregated) schottky diode and the common drain (305) and source (307) terminals of the LDMOS transistor may be achieved. Also, the relative area allocated to the composite schottky diode and LDMOS transistor may be controlled by the ratio of component schottky structures and component transistors of the LDMOS device. For example, while a roughly 2:1 component-transistor to component-schottky is illustrated in FIG. 4, there may be more component transistors per component schottky structures in alternative embodiments.

Detail view 311 illustrates an exemplary layout of transistor components and schottky components within region 309, showing the disposition of drain, gate and source terminals of each component transistor within HV N-well 303, the disposition of the component schottky diode 306 between otherwise adjacent drain terminals (designated 'd' in detail view 311), the common-drain interconnections, and also the common-source interconnections and the transistor-source-to-schottky-anode interconnections. Further detail regarding the component transistors and component schottky diode 306 (marked by 'M' for the metal that forms the schottky barrier with the HV N-well 303) are illustrated in the profile view at 329 and the corresponding schematic diagram at 331. In effect, the shared N+ drain 281 shown in detail view of FIG. 3 is split into separate N+ regions 341a and 341b to provide space therebetween for the schottky anode 343 (i.e., metal feature 343). Adjacent source terminals (formed by P+, N+ regions 335, 337 within P-body 333 as discussed above) may remain shared as discussed above, with a shared interconnection 318 as shown in detail view 311. The HV N-well 303 in which the component transistors are formed may remain unchanged for the component schottky diode 306 and, significantly, the N+ drain regions of the component transistors 341a, 341b may double as the cathodes of respective component schottky diodes. Consequently, the component schottky diode may be instantiated by mere addition of metal feature 343 to provide the schottky anode. Referring to schematic view 331, it can be seen that the metal feature 343 establishes a shared anode for a pair of component schottky diodes 365, 367 that have respective cathodes at the N+ regions 341a and 341b which double as the drains of component transistors 351, 363. In both detail views, 329 and 331, interconnections of transistor source terminals and the schottky anode (i.e., metal feature 343) are shown at 346, and the interconnections of transistor drain terminals (which double as the schottky cathodes) are shown at 348.

It should be noted that the various circuits, layouts, IC devices and IC packages disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A power-delivery integrated circuit device comprising:
   a composite transistor formed by a plurality of component transistors, arranged in parallel, that have commonly coupled source terminals, commonly coupled drain terminals and commonly coupled gate terminals; and
   a composite schottky diode formed by a plurality of component schottky diodes, arranged in parallel, that have anodes coupled in common and coupled to the source terminals of the plurality of components transistors, and for which drain terminals of the commonly coupled drain terminals constitute respective cathodes,
   wherein the composite schottky diode is coupled between a source and a drain of a bypass transistor within power-stage circuitry of the power-delivery integrated circuit device.

2. The integrated circuit device of claim 1 wherein the plurality of component transistors and the plurality of component schottky diodes comprise a high-voltage N-type well disposed within a P-type semiconductor substrate.

3. The integrated circuit device of claim 1 wherein the composite transistor comprises a laterally-diffused metal-oxide-semiconductor transistor.

4. The integrated circuit device of claim 1 wherein the plurality of component transistors are disposed in an array that includes rows and columns of the component transistors.

5. The integrated circuit device of claim 1 wherein the plurality of component schottky diodes are disposed within the array of component transistors.

6. The integrated circuit device of claim 1 wherein the commonly coupled gate terminals comprise polysilicon structures that are disposed on a semiconductor substrate and wherein the plurality of component schottky diodes comprise metal features disposed on the semiconductor substrate between respective pairs of the polysilicon structures.

7. The integrated circuit device of claim 1 wherein the plurality of component schottky diodes comprise metal features disposed on a semiconductor substrate, each of the metal features constituting the anodes of at least two of the component schottky diodes.

8. The integrated circuit device of claim 1 wherein the anodes of the plurality of component schottky diodes and the source terminals of the plurality of component transistors are coupled to a ground reference node.

9. A method comprising:
   switching on a first plurality of component transistors during a first interval, each of the component transistors being coupled in parallel to provide a path for a current to flow to a load element; and
   switching off the first plurality of component transistors during a second interval to avoid establishing a path to ground through the first plurality of component transistors, the path for the current to flow to the load element being established through a plurality of component schottky diodes that are coupled, in parallel, anode-to-cathode between source terminals and drain terminals, respectively, of the plurality of component transistors,
   wherein the plurality of component schottky diodes are coupled between a source and a drain of a bypass transistor within power-stage circuitry of a power-delivery integrated circuit device.

10. The method of claim 9 further comprising receiving a control signal that includes a first pulse, switching on a second plurality of component transistors for the duration of the first pulse, switching off the second plurality of component transistors at the conclusion of the first pulse, delaying for the third interval after switching off the second plurality of component transistors, and wherein switching on a first plurality of component transistors during a first interval comprises switching on the first plurality of component transistors after delaying for the third interval.

11. The method of claim 9 wherein the second interval precedes a second pulse in the control signal, the method further comprising switching on the second plurality of component transistors for the duration of the second pulse.

12. An integrated-circuit (IC) power delivery system comprising a plurality of integrated circuit devices, each of the integrated circuit devices including:
   a composite transistor formed by a plurality of component transistors, arranged in parallel, that have commonly coupled source terminals, commonly coupled drain terminals and commonly coupled gate terminals; and
   a composite schottky diode formed by a plurality of component schottky diodes, arranged in parallel, that have anodes coupled in common and coupled to the source terminals of the plurality of component transistors, and for which drain terminals of the commonly coupled drain terminals constitute respective cathodes, wherein the composite schottky diode is coupled between a source and a drain of a bypass transistor within power-stage circuitry of the power-delivery integrated circuit device.

13. The IC power delivery system of claim 12 wherein the plurality of component transistors and the plurality of component schottky diodes comprise a high-voltage N-type well disposed within the P-type semiconductor substrate.

14. The IC power delivery system of claim 12 wherein the plurality of component transistors are disposed in an array that includes rows and columns of the component transistors.

15. The IC power delivery system of claim 14 wherein the plurality of component schottky diodes are disposed within the array of component transistors.

16. An integrated circuit device comprising:
   means for switching on a first plurality of component transistors during a first interval, each of the component transistors being coupled in parallel to provide a path for a current to flow to a load element; and
   means for switching off the first plurality of component transistors during a second interval to avoid establishing a path to ground through the first plurality of component transistors, the path for the current to flow to the load element being established through a plurality of component schottky diodes that are coupled, in parallel, anode-to-cathode between source terminals and drain terminals, respectively, of the plurality of component transistors,
   wherein the plurality of component schottky diodes are coupled between a source and a drain of a bypass transistor within power-stage circuitry of a power-delivery integrated circuit device.

17. The integrated circuit device of claim 16 further comprising means for receiving a control signal that includes a first pulse, means for switching on a second plurality of component transistors for the duration of the first pulse, means for switching off the second plurality of component transistors at the conclusion of the first pulse, means for delaying for the third interval after switching off the second plurality of component transistors, and wherein the means for switching on a first plurality of component transistors during a first interval comprises means for switching on the first plurality of component transistors after delaying for the third interval.

18. Computer-readable media having information embodied therein that includes a description of an integrated circuit device for delivering power to a load, the information including descriptions of:
   a composite transistor formed by a plurality of component transistors, arranged in parallel, that have commonly coupled source terminals, commonly coupled drain terminals and commonly coupled gate terminals; and
   a composite schottky diode formed by a plurality of component schottky diodes, arranged in parallel, that have anodes coupled in common and coupled to the source terminals of the plurality of components transistors, and for which drain terminals of the commonly coupled drain terminals constitute respective cathodes,
   wherein the composite schottky diode is coupled between a source and a drain of a bypass transistor within power-stage circuitry of the power-delivery integrated circuit device.

* * * * *